United States Patent
Wei et al.

(10) Patent No.: US 10,790,215 B1
(45) Date of Patent: Sep. 29, 2020

(54) HEAT DISSIPATION DEVICE

(71) Applicant: COOLER MASTER TECHNOLOGY INC., New Taipei (TW)

(72) Inventors: Yu-Te Wei, New Taipei (TW); Di Han Wu, New Taipei (TW)

(73) Assignee: COOLER MASTER TECHNOLOGY INC., New Taipei (TW)

(*) Notice: Subject to any disclaimer, the term of this patent is extended or adjusted under 35 U.S.C. 154(b) by 0 days.

(21) Appl. No.: 16/591,452

(22) Filed: Oct. 2, 2019

(30) Foreign Application Priority Data

May 27, 2019 (CN) .......................... 2019 1 0445505

(51) Int. Cl.
| | | |
|---|---|---|
| *H01L 23/40* | (2006.01) | |
| *H05K 7/20* | (2006.01) | |
| *H01L 23/427* | (2006.01) | |
| *F28D 1/02* | (2006.01) | |
| *F28D 15/02* | (2006.01) | |

(52) U.S. Cl.
CPC ........ *H01L 23/4006* (2013.01); *F28D 1/0233* (2013.01); *F28D 15/0275* (2013.01); *H01L 23/427* (2013.01); *H01L 2023/4068* (2013.01); *H01L 2023/4087* (2013.01)

(58) Field of Classification Search
CPC ...... H05K 7/20; H05K 1/0203; H05K 7/2039; H05K 7/20409; H05K 2201/10598; F28D 1/10233; F28D 15/0275; H01L 23/4006; H01L 2023/4087; F28F 3/06; G06F 1/20
See application file for complete search history.

(56) References Cited

U.S. PATENT DOCUMENTS

| | | | | |
|---|---|---|---|---|
| 5,662,163 A * | 9/1997 | Mira | .................... | H01L 23/4006 165/185 |
| 5,947,192 A * | 9/1999 | Kuo | .................... | H01L 23/3672 165/121 |
| 6,141,220 A * | 10/2000 | Lin | .................... | H01L 23/4093 165/185 |
| 6,374,906 B1 * | 4/2002 | Peterson | ............. | H01L 23/3672 165/185 |
| 6,384,331 B1 * | 5/2002 | Ku | .................... | G06F 1/20 174/544 |
| 6,404,632 B1 * | 6/2002 | Forkas | ................ | H01L 23/4006 165/185 |
| 6,788,536 B2 * | 9/2004 | Lai | .................... | H01L 23/4006 165/121 |

(Continued)

*Primary Examiner* — Binh B Tran
*Assistant Examiner* — Michael A Matey
(74) *Attorney, Agent, or Firm* — Maschoff Brennan

(57) ABSTRACT

This disclosure provides a heat dissipation device configured to be in thermal contact with a heat source of a circuit board and including a main body part and an engagement assembly. The main body part includes a thermally conductive component and at least one fin assembly. The thermally conductive component is configured to be in thermal contact with the heat source, and the at least one fin assembly is thermally coupled to the thermally conductive component. The engagement assembly includes at least one first cover and at least one fastener. The at least one first cover presses against a side of the at least one fin assembly that is located away from the heat source. The at least one fastener is disposed through the at least one first cover and the at least one fin assembly and is configured to be fixed to the circuit board.

30 Claims, 6 Drawing Sheets

(56) References Cited

U.S. PATENT DOCUMENTS

| | | | | |
|---|---|---|---|---|
| 7,174,951 B1* | 2/2007 | Lin | ............................ | F28D 15/02 165/104.21 |
| 7,215,548 B1* | 5/2007 | Wu | ............................ | H01L 23/427 361/703 |
| 7,352,586 B2* | 4/2008 | Kuang | ............................ | G06F 1/183 165/185 |
| 7,443,676 B1* | 10/2008 | Li | ............................ | H01L 23/427 165/104.33 |
| 7,474,532 B1* | 1/2009 | Desrosiers | ............................ | H01L 23/4006 165/185 |
| 7,766,074 B2* | 8/2010 | Lin | ............................ | H01L 23/467 165/80.2 |
| 9,433,079 B2* | 8/2016 | Chiang | ............................ | H05K 1/0203 |
| 2002/0030972 A1* | 3/2002 | Ali | ............................ | H01L 23/427 361/704 |
| 2002/0067599 A1* | 6/2002 | Mann | ............................ | H01L 23/4006 361/704 |
| 2004/0174679 A1* | 9/2004 | Hung | ............................ | H01L 23/4006 361/704 |
| 2004/0247925 A1* | 12/2004 | Cromwell | ............................ | H05K 7/1061 428/548 |
| 2005/0068741 A1* | 3/2005 | Bailey | ............................ | H01L 23/433 361/719 |
| 2006/0285297 A1* | 12/2006 | Conner | ............................ | H01L 23/4006 361/710 |
| 2008/0084664 A1* | 4/2008 | Campbell | ............................ | H05K 7/20772 361/699 |
| 2008/0144286 A1* | 6/2008 | Li | ............................ | H01L 23/4006 361/701 |
| 2009/0059532 A1* | 3/2009 | Li | ............................ | H01L 23/427 361/709 |
| 2009/0161316 A1* | 6/2009 | Xu | ............................ | H01L 23/467 361/700 |
| 2010/0000715 A1* | 1/2010 | Zheng | ............................ | H01L 23/467 165/80.3 |
| 2010/0101756 A1* | 4/2010 | Chu | ............................ | H01L 23/427 165/80.3 |
| 2010/0232109 A1* | 9/2010 | Liu | ............................ | H01L 23/427 361/697 |
| 2011/0120668 A1* | 5/2011 | Li | ............................ | F28D 15/02 165/67 |
| 2012/0098401 A1* | 4/2012 | Yu | ............................ | F21V 29/767 313/46 |
| 2016/0295679 A1* | 10/2016 | Yeini | ............................ | H05K 5/061 |
| 2016/0360645 A1* | 12/2016 | Achard | ............................ | H01L 23/367 |
| 2019/0045662 A1* | 2/2019 | Schroeder | ............................ | H05K 7/20272 |

* cited by examiner

HEAT DISSIPATION DEVICE

CROSS-REFERENCE TO RELATED APPLICATIONS

This non-provisional application claims priority under 35 U.S.C. § 119(a) on Patent Application No(s). 2019-10445505.1 filed in on China, on May 27, 2019, the entire contents of which are hereby incorporated by reference.

TECHNICAL FIELD

The disclosure relates to a heat dissipation device, more particularly to a heat dissipation device having a fastener.

BACKGROUND

Heat is generated during the operation of an electronic device, and if such heat is not effectively dissipated, the heat generation would increase the temperature of the electronic device and thus leading damage of the electronic device. Therefore, heat dissipation device and its quality play a key role in the operation and performance of the electronic device.

In the conventional heat dissipation device, a heat pipe is provided to thermally connect a thermally conductive block which is placed on the heat source to a heatsink, and sometimes, a fan is provided to help the heat dissipation. In general, the thermally conductive block is fixed to the main board that has the heat source by being screwed onto a bracket fixed on the main board. However, as the heat dissipation device is placed on the bracket, the heatsink covers the bracket, making the assembly personnel difficult to screw the bracket to the main board.

In addition, in case that the main board is disposed in a vertical manner, the heat dissipation device has to be placed in a horizontal manner accordingly, such that the heatsink has to be placed horizontally; however, the heatsink is not screwed to the main board and is only supported by the heat pipe. As a result, the heatsink will gradually move away from its original position due to gravitational force.

Therefore, it is desirable to figure out a way to conveniently and firmly install the heat dissipation device.

SUMMARY

An embodiment of the disclosure provides a heat dissipation device configured to be in thermal contact with a heat source of a circuit board and including a main body part and an engagement assembly. The main body part includes a thermally conductive component and at least one fin assembly. The thermally conductive component is configured to be in thermal contact with the heat source, and the at least one fin assembly is thermally coupled to the thermally conductive component. The engagement assembly includes at least one first cover and at least one fastener. The at least one first cover presses against a side of the at least one fin assembly that is located away from the heat source. The at least one fastener is disposed through the at least one first cover and the at least one fin assembly and is configured to be fixed to the circuit board.

Another embodiment of the disclosure provides a heat dissipation device configured to be in thermal contact with a heat source of a circuit board and including a main body part and an engagement assembly. The main body part includes a heat absorbing part and at least one heat dissipation part that are thermally coupled to each other. A distance between the heat absorbing part and the circuit board is smaller than a distance between the at least one heat dissipation part and the circuit board. The engagement assembly includes at least one first cover and at least one fastener. The at least one first cover presses against the at least one heat dissipation part. The at least one fastener is disposed through the at least one first cover and the at least one heat dissipation part and is configured to be fixed to the circuit board.

According to the heat dissipation device discussed above, since the heat dissipation device includes no component on a side of the head part facing away from the heat source, no component would interfere with the hand tool during the assembly of the heat dissipation device. In other words, the head parts of the fasteners are arranged at the side of the first cover facing away from the heat source, which provides the assembly personnel or user a convenient approach to assembly the heat dissipation device by the hand tool.

In addition, since the fasteners are disposed through the fins of the fin assembly and screwed to the mount assembly, the fasteners are able to share the weight of the fin assemblies and thus stabling the installation of the heat dissipation device on the circuit board. In some cases, when the whole system is placed in an inclined or horizontal position to make the circuit board not placed flat, the fasteners are still able to maintain the position of the fin assemblies of the heat dissipation device.

Above summary and following detailed descriptions are used to demonstrate and illustrate the principle of the disclosure and provide a further explanation of the claims.

DETAILED DESCRIPTION

Figure 1:
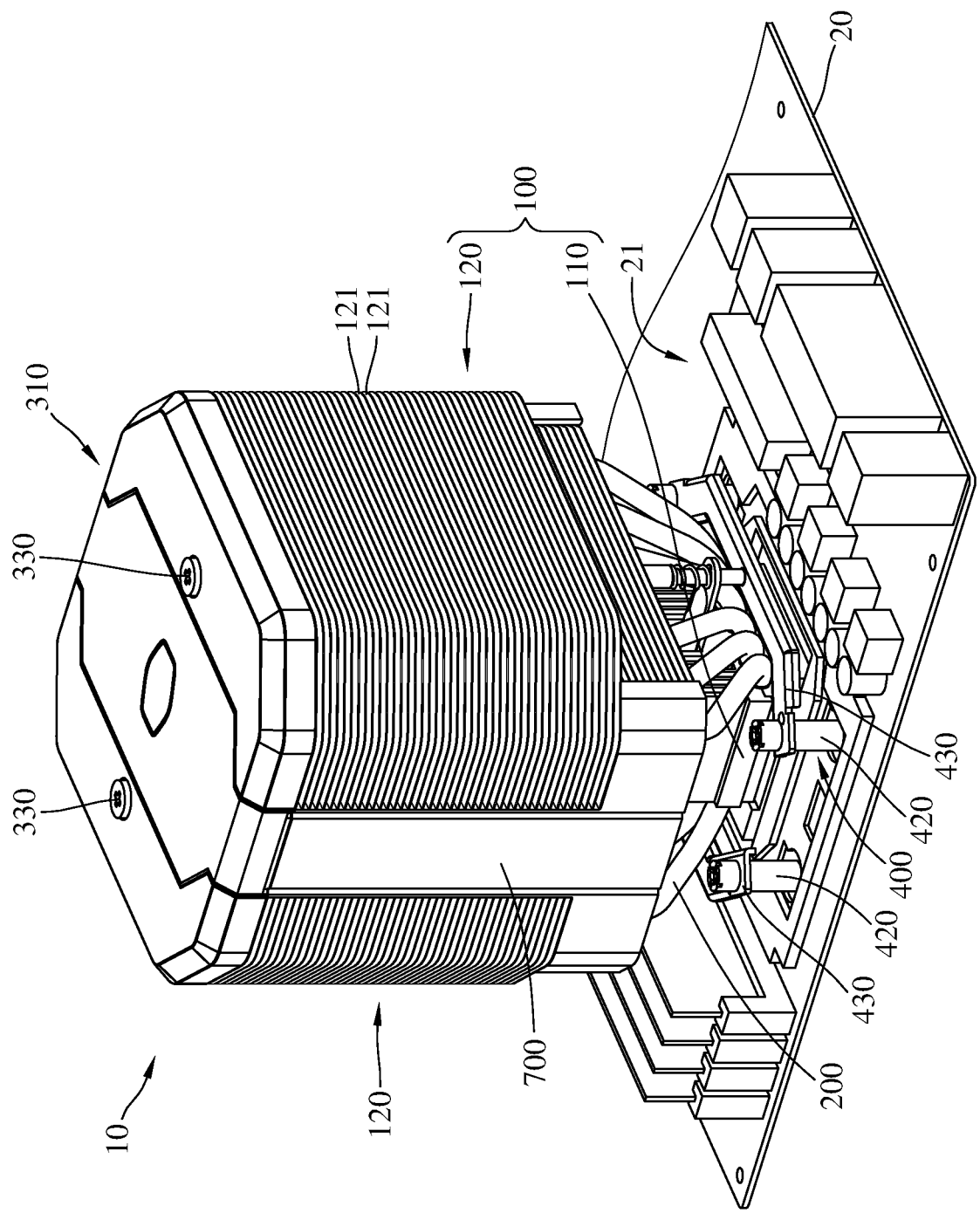
FIG. 1 is a perspective view of a heat dissipation device according to a first embodiment of the disclosure.
Figure 2:
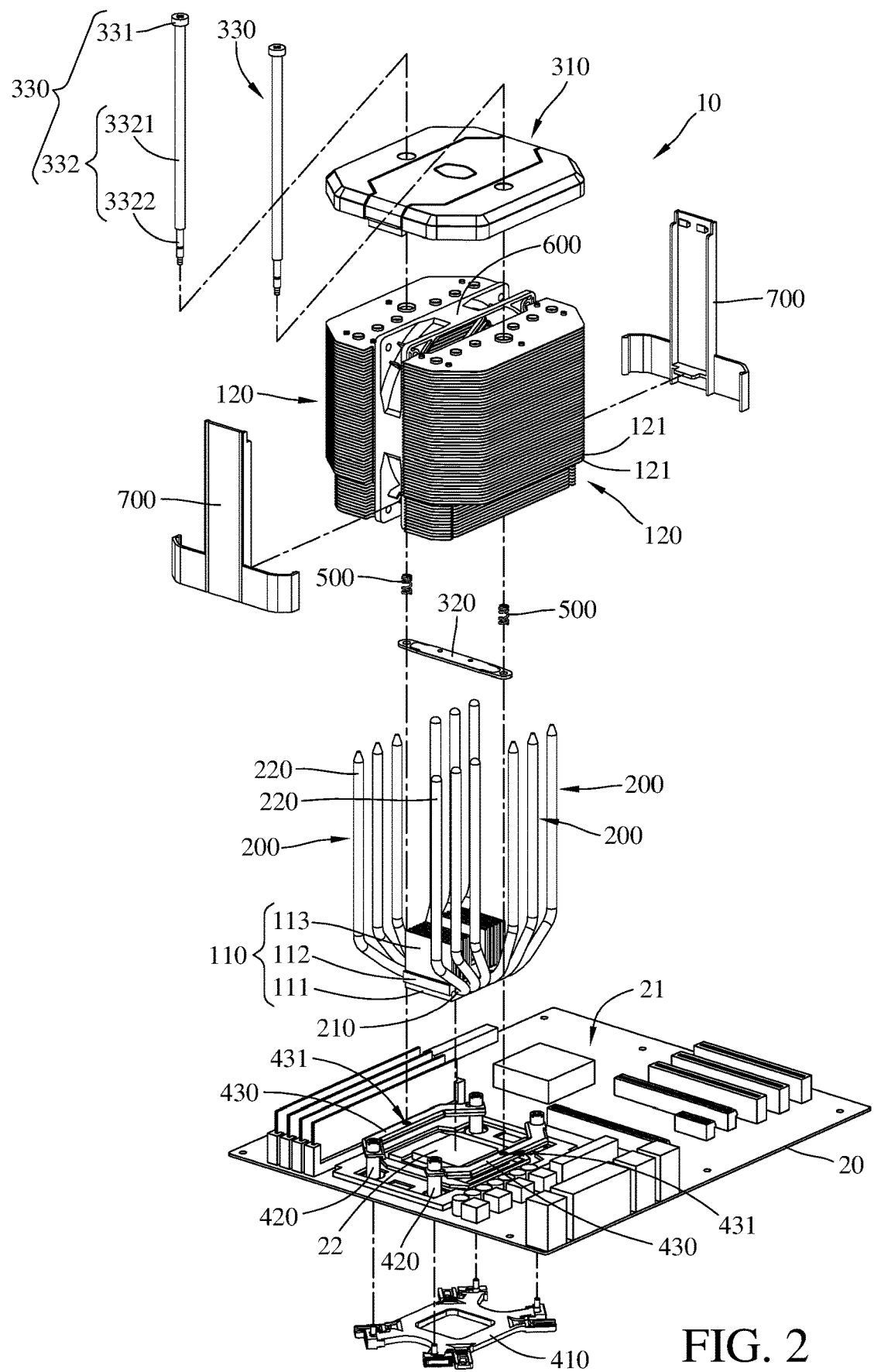
FIG. 2 is an exploded view of the heat dissipation device in FIG. 1.

Please refer to FIG. 1 to FIG. 2. FIG. 1 is a perspective view of a heat dissipation device according to a first embodiment of the disclosure. FIG. 2 is an exploded view of the heat dissipation device in FIG. 1.

This embodiment provides a heat dissipation device 10. The heat dissipation device 10 is configured to be in thermal contact with a heat source 22 disposed on a circuit board 20. The heat source 22 is, for example, a central processing unit, a southbridge chip, a northbridge chip, or a graphic processing unit, but the disclosure is not limited thereto.

The heat dissipation device 10 includes a main body part 100, a plurality of heat pipes 200 and an engagement assembly 300. The main body part 100 includes a thermally conductive component 110 and two fin assemblies 120, where the thermally conductive component 110 may be regarded as a heat absorbing part of the heat dissipation device 10, and the two fin assemblies 120 may be regarded as heat dissipation parts of the heat dissipation device 10.

The thermally conductive component 110 is configured to be in thermal contact with the heat source 22. The fin assembly 120 includes a plurality of fins 121 arranged side by side and spaced apart from one another, such that every two adjacent fins 121 are separated by a gap, and the gap allows airflow to flow therethrough. Each of the heat pipes 200 has a first pipe part 210, and two second pipe parts 220, where one of the second pipe parts 220 is connected to the other second pipe part 220 via the first pipe part 210, the first pipe part 210 is disposed through the thermally conductive component 110, and the two second pipe parts 220 are respectively disposed through the two fin assemblies 120. Therefore, the thermally conductive component 110 is able to be thermally coupled to the two fin assemblies 120 via the heat pipes 200. In addition, the thermally conductive component 110 and the heat pipes 200 are fixed to each other by, for example, welding or tight contact. Similarly, the heat pipes 200 and the fin assembly 120 are fixed to each other by, for example, welding or tight contact.

Figure 3:
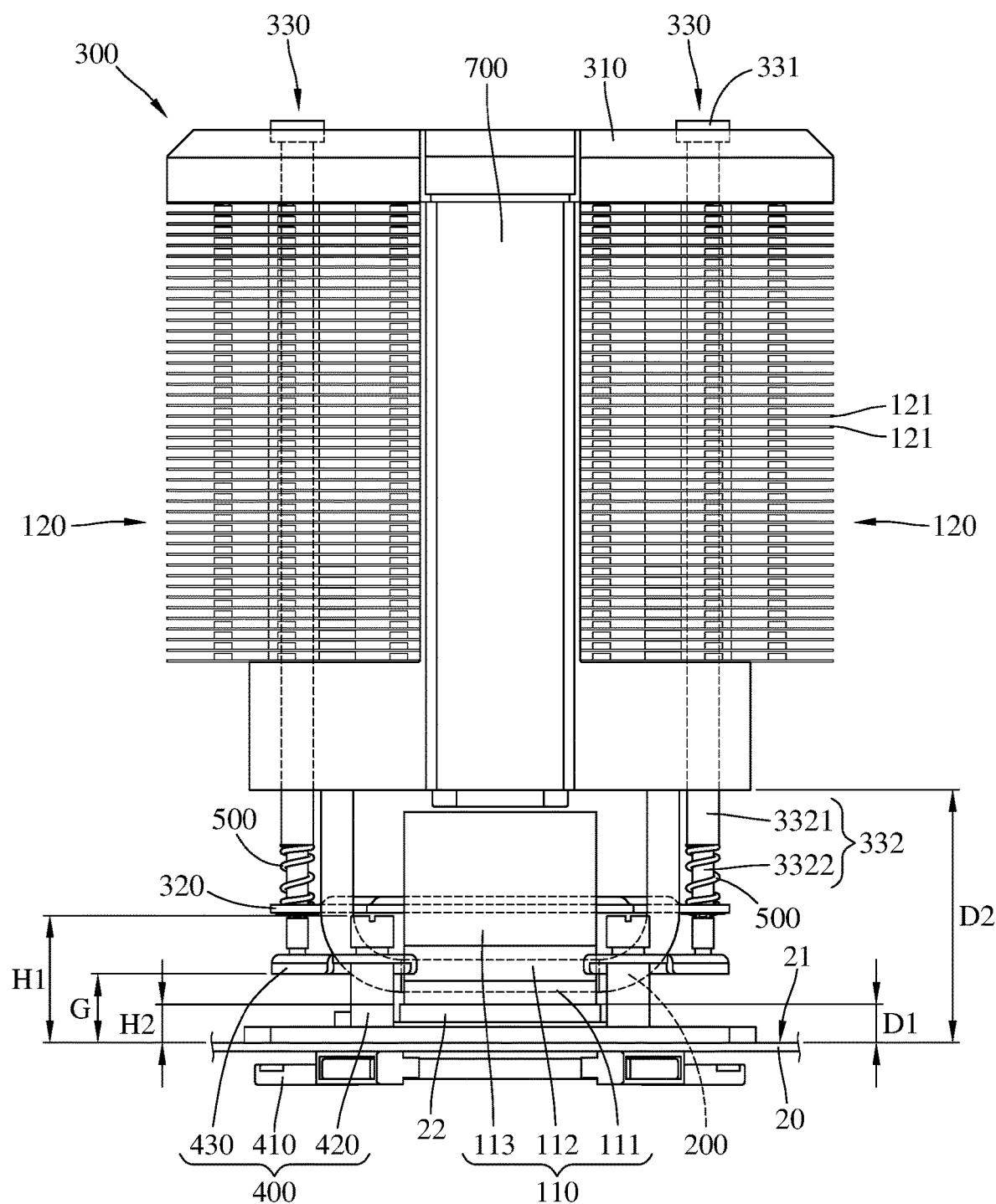
FIG. 3 is a side view of the heat dissipation device in FIG. 1.
Figure 4:
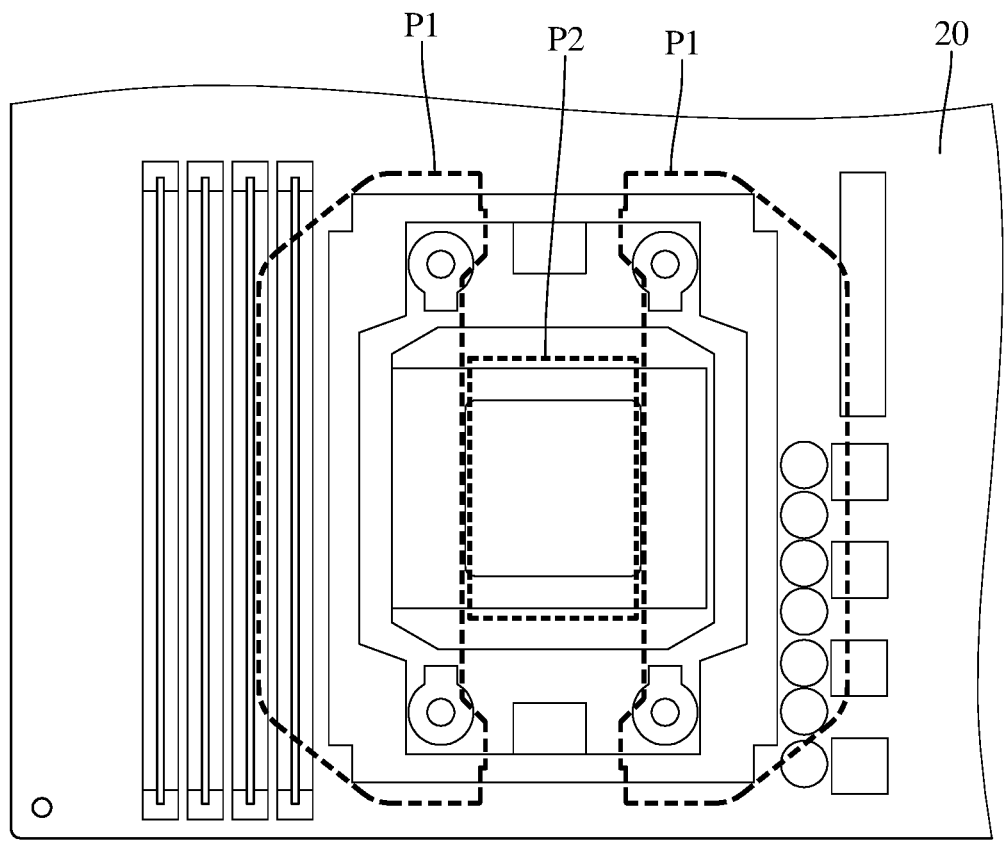
FIG. 4 is a planar view showing orthogonal projections of a thermally conductive component and two fin assemblies on a circuit board according to the first embodiment of the disclosure.

Please refer to FIG. 3 and FIG. 4. FIG. 3 is a side view of the heat dissipation device in FIG. 1. FIG. 4 is a planar view showing orthogonal projections of a thermally conductive component and two fin assemblies on a circuit board according to the first embodiment of the disclosure. In this embodiment, a distance D1 between the thermally conductive component 110 and the circuit board 20 is smaller than a distance D2 between the fin assembly 120 and the circuit board 20, and an orthogonal projection P1 of the fin assembly 120 on the circuit board 20 is entirely located outside an orthogonal projection P2 of the thermally conductive component 110 on the circuit board 20. That is to say that the orthogonal projection P1 of the fin assembly 120 on the circuit board 20 does not overlap with the orthogonal projection P2 of the thermally conductive component 110 on the circuit board 20, but the disclosure is not limited thereto. In other embodiments, the orthogonal projection P1 of the fin assembly 120 on the circuit board 20 may partially located inside the orthogonal projection P2 of the thermally conductive component 110 on the circuit board 20, and that is to say that the orthogonal projection P1 of the fin assembly 120 on the circuit board 20 partially overlaps with the orthogonal projection P2 of the thermally conductive component 110 on the circuit board 20.

In this embodiment, the thermally conductive component 110 further includes a first contact part 111, a second contact part 112 and a plurality of fin parts 113. The first contact part 111 is configured to be in thermal contact with the heat source 22. The second contact part 112 is disposed on the first contact part 111, and the first pipe parts 210 of the heat pipes 200 are disposed between and thermally connected to the first contact part 111 and the second contact part 112. The fin parts 113 are disposed on the side of the second contact part 112 opposite to the first contact part 111 so as to improve the heat dissipation efficiency of the thermally conductive component 110.

The engagement assembly 300 includes a first cover 310, a second cover 320 and two fasteners 330. The first cover 310 can be disposed on two respective sides of the fin assemblies 120 that are located away from the heat source 22. The second cover 320 can be disposed on a side of the thermally conductive component 110 that is located away from the heat source 22. The two fasteners 330 are disposed through the first cover 310 and the second cover 320 and respectively disposed through the two fin assemblies 120, and are fixed to the circuit board 20.

In this embodiment, the fasteners 330 are not directly fixed to the circuit board 20. In detail, in this embodiment, the heat dissipation device 10 further includes a mount assembly 400 and the fastener 330 is mounted on the circuit board 20 via the mount assembly 400. In detail, the mount assembly 400 includes a first frame part 410, a plurality of connecting parts 420 and two second frame parts 430. The connecting parts 420 are disposed through the circuit board 20, and the first frame part 410 is fixed to the second frame parts 420 via the connecting parts 420, where the first frame part 410 is disposed on a side of the circuit board 20 that is located away from the heat source 22, and the second frame parts 430 are disposed above a surface 21 of the circuit board 20 facing the heat source 22. As shown in FIG. 3, a height H1 of the part of the connecting part 420 protruding from the surface 21 of the circuit board 20 is larger than a height H2 of the heat source 22 from the surface 21, and the connecting parts 420 keep the second frame parts 430 at a distance G to the surface 21 of the circuit board 20, where the distance G is larger than the height H2. In addition, each second frame part 430 has a screw hole 431, and the two fasteners 330 are respectively screwed into the screw holes 431 of the second frame parts 430 so that the engagement assembly 300 can fix the main body part 100 in position on the circuit board 20.

With the help of the mount assembly 400, the fasteners 330 can be avoided from interfering with the electronic components on the circuit board 20, such that the area of the circuit board 20 for the electronic components becomes more flexible, but the disclosure is not limited thereto. In other embodiments, the fastener may also be directly fixed to the circuit board.

In this embodiment, the heat dissipation device 10 further includes two elastic components 500. The elastic components 500 are, for example, compression springs. Each fastener 330 includes a head part 331 and a body part 332 that are connected to each other. As the fastener 330 is disposed through the first cover 310, the second cover 320 and one of the fin assemblies 120, the head part 331 presses against the side of the first cover 310 that is located away from the heat source 22. The body part 332 includes a wider portion 3321 and a narrower portion 3322 that are connected to each other. The wider portion 3321 is located between and connected to the head part 331 and the narrower portion 3322. A diameter of the wider portion 3321 is larger than that of the narrower portion 3322. The wider portion 3321 can be disposed through the first cover 310 and one of the fin assemblies 120, meanwhile, and the narrower portion 3322 is disposed through the second cover 320 and screwed into the screw holes 431 of one of the second frame parts 430. The elastic component 500 is sleeved on the narrower portion 3322 and is located between and clamped by the wider portion 3321 and the second cover 320; specifically, two opposite ends of each elastic component 500 respectively presses against a surface of the wider portion 3321 facing toward the circuit board 20 and a surface of the second cover 320 facing toward the wider portion 3321. Therefore, the compressed elastic component 500 is able to constantly force the thermally conductive component 110 to press against the heat source 22, thereby improving the thermal contact between the thermally conductive component 110 and the heat source 22 and thus improving the heat transfer therebetween.

In this embodiment, the heat dissipation device 10 further includes an airflow generator 600. The airflow generator 600 is located between the two fin assemblies 120. The airflow generator 600 is, for example, a fan. The airflow generator 600 is configured to generate an airflow flowing through the gaps of the fin assemblies 120 so as to dissipate heat in the fin assemblies.

In this embodiment, the heat dissipation device 10 further includes two side covers 700. The two side covers 700 are respectively disposed at two opposite sides of the fin assemblies 120 so as to respectively cover two opposite sides of the airflow generator 600. The two side covers 700 help to strengthen and further improve the stability of the connection between the fin assemblies 120 and the airflow generator 600.

Figure 5:
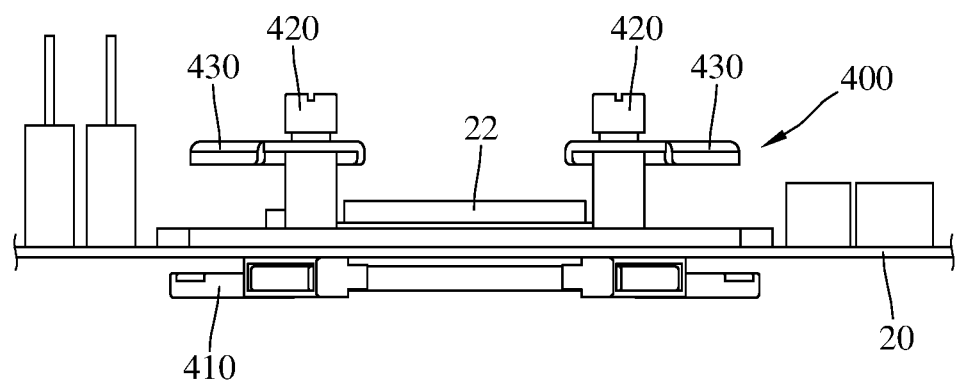
FIG. 5 to FIG. 7 illustrate an assembly process of the heat dissipation device on the circuit board.
Figure 6:
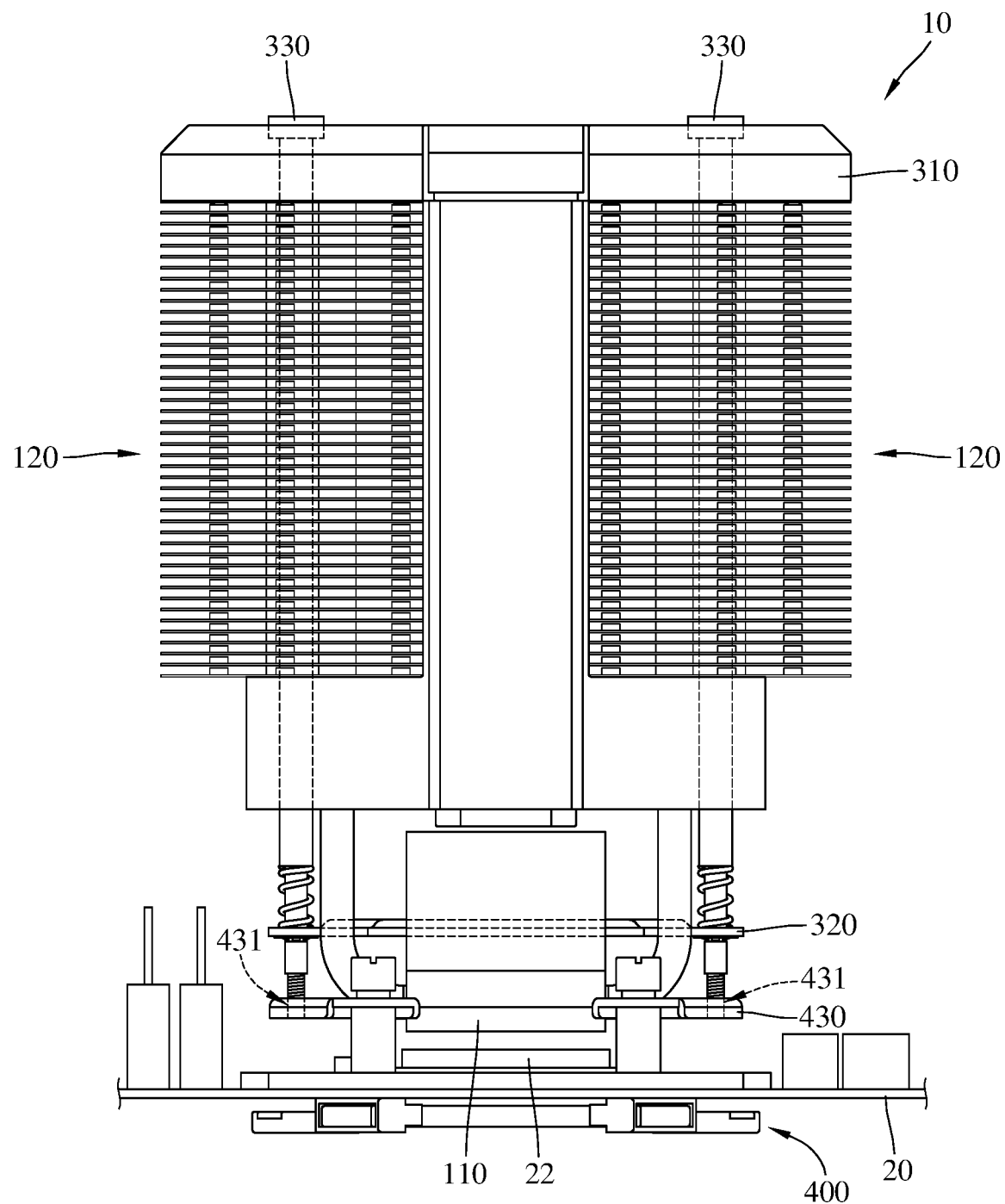
Figure 7:
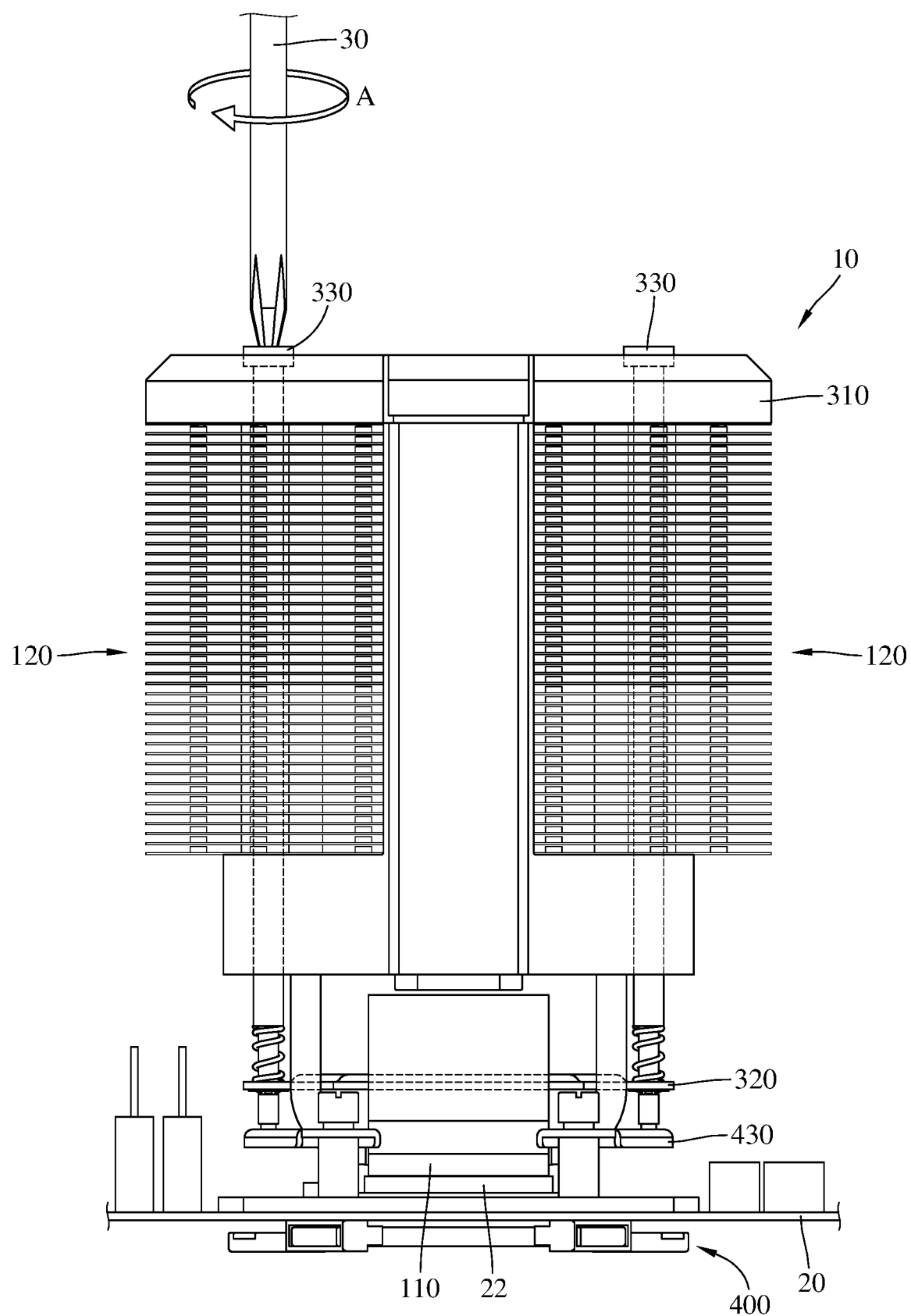

Then, please refer to FIG. 5 to FIG. 7, FIGS. 5 to 7 illustrate an assembly process of the heat dissipation device 10 on the circuit board 20.

Firstly, as shown in FIG. 5, the mount assembly 400 is installed on the circuit board 20. In detail, the second frame parts 430 of the mount assembly 400 are disposed above the surface 21 of the circuit board 20 facing the heat source 22. The heat source 22 may be coated with thermally conductive adhesive (not shown). Then, as shown in FIG. 6, the fasteners 330 which are disposed through the first cover 310, the second cover 320 and the fin assemblies 120 are respectively screwed into the screw holes 431 of the second frame parts 430. Then, as shown in FIG. 7, a hand tool 30, such as a screwdriver, is provided to push and rotate the fasteners 330 of the engagement assembly 300 (e.g., along a direction A). By doing so, the narrower portions 3322 of the fasteners 330 are screwed into the screw holes 431 of the second frame parts 430, such that the thermally conductive component 110 of the heat dissipation device 10 is firmly stacked on the heat source 22.

As shown in FIG. 7, since the heat dissipation device 10 includes no component on a side of the head part 331 facing away from the heat source 22, no component would interfere with the hand tool 30 during the assembly of the heat dissipation device 10. In other words, the head parts 331 of the fasteners 330 are arranged at the side of the first cover 310 facing away from the heat source 22, which provides the assembly personnel or user a convenient approach to assembly the heat dissipation device 10 by the hand tool 30.

In addition, since the fasteners 330 are disposed through the fins 121 of the fin assembly 120 and screwed to the mount assembly 400, the fasteners 330 are able to share the weight of the fin assemblies 120 and thus stabling the installation of the heat dissipation device 10 on the circuit board 20. In some cases, when the whole system is placed in an inclined or horizontal position to make the circuit board 20 not placed flat, the fasteners 330 are still able to maintain the position of the fin assemblies 120 of the heat dissipation device 10.

In the above embodiments, the heat dissipation device 10 has more than one heat pipes 200, but the disclosure is not limited thereto; in other embodiments, the heat dissipation device may have only one heat pipe. In addition, in the above embodiments, the heat pipes 200 are disposed through the thermally conductive component 110 and the fin assemblies 120, but the disclosure is not limited thereto; in other embodiments, the heat pipes may be just disposed at the outer surfaces of the thermally conductive component and the fin assemblies.

In the above embodiments, the heat dissipation device 10 has more than one fin assemblies 120, but the disclosure is not limited thereto; in other embodiments, the heat dissipation device may have only one fin assembly.

Further, the disclosure is not limited to the configuration and quantity of the second frame parts 430; in other embodiments, the mount assembly 400 may have only one second frame part, and the second frame part may be in a ring shape.

In the above embodiments, the positions of the connecting parts 420 of the mount assembly 400 are unadjustable, but the disclosure is not limited thereto; in other embodiments, the positions of the connecting parts of the mount assembly can be adjustable, such that the connecting parts are able to fit the arrangement of the screw holes of the circuit board, allowing the heat dissipation device to be applicable to various types of circuit boards.

In the above embodiments, the engagement assembly 300 includes one first cover 310, but the disclosure is not limited thereto; in other embodiments, the engagement assembly 300 may have two first covers respectively pressing against the two fin assemblies.

In the above embodiments, the heat dissipation device 10 is an air-cooling device, but the disclosure is not limited thereto; in other embodiment, the heat dissipation device may be a liquid-cooling device, in such as case, the thermally conductive component 110 can be modified to be a water block and the fin assembly 120 can be modified to be a water type radiator.

According to the heat dissipation device discussed above, since the heat dissipation device includes no component on a side of the head part facing away from the heat source, no component would interfere with the hand tool during the assembly of the heat dissipation device. In other words, the head parts of the fasteners are arranged at the side of the first cover facing away from the heat source, which provides the assembly personnel or user a convenient approach to assembly the heat dissipation device by the hand tool.

In addition, since the fasteners are disposed through the fins of the fin assembly and screwed to the mount assembly, the fasteners are able to share the weight of the fin assemblies and thus stabling the installation of the heat dissipation device on the circuit board. In some cases, when the whole system is placed in an inclined or horizontal position to make the circuit board not placed flat, the fasteners are still able to maintain the position of the fin assemblies of the heat dissipation device.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A heat dissipation device, configured to be in thermal contact with a heat source of a circuit board, the heat dissipation device comprising: a main body part, comprising a thermally conductive component and at least one fin assembly, wherein the thermally conductive component is configured to be in thermal contact with the heat source, and the at least one fin assembly is thermally coupled to the thermally conductive component; and an engagement assembly, comprising at least one first cover, a second cover and at least one fastener, wherein the at least one first cover presses against a side of the at least one fin assembly that is located away from the heat source, and the at least one fastener is disposed through the at least one first cover and the at least one fin assembly and is configured to be fixed to the circuit board; wherein the heat dissipation device further comprises a mount assembly configured to be disposed on the circuit board, the mount assembly has at least one screw hole, the at least one fastener is disposed through the at least one first cover, the at least one fin assembly, and the second cover and is screwed into the at least one screw hole of the mount assembly so as to be fixed on the circuit board.

2. The heat dissipation device according to claim 1, wherein the second cover presses against a side of the thermally conductive component that is located away from the heat source, and the at least one fastener is disposed through the at least one first cover, the at least one fin assembly, and the second cover.

3. The heat dissipation device according to claim 1, further comprising an elastic component, wherein the fastener comprises a head part and a body part that are connected to each other, the body part comprises a wider portion and a narrower portion that are connected to each other, the wider portion is located between and connected to the head part and the narrower portion, the wider portion is disposed through the first cover and the at least one fin assembly, the narrower portion is disposed through the second cover and screwed into the at least one screw hole of the mount assembly, and two opposite ends of the elastic component respectively press against a surface of the wider portion facing toward the circuit board and a surface of the second cover facing toward the wider portion.

4. The heat dissipation device according to claim 2, wherein the at least one fastener is configured to be fixed to the circuit board.

5. The heat dissipation device according to claim 2, further comprising at least one heat pipe thermally connected to the thermally conductive component and the at least one fin assembly.

6. The heat dissipation device according to claim 5, wherein the main body part comprises two fin assemblies, the at least one heat pipe has a first pipe part and two second pipe parts, one of the two second pipe parts is connected to the other second pipe part via the first pipe part, the first pipe part is in thermal contact with the thermally conductive component, and two second pipe parts are respectively in thermal contact with the two fin assemblies.

7. The heat dissipation device according to claim 6, wherein the first pipe part of the at least one heat pipe is disposed through the thermally conductive component, and the two second pipe parts of the at least one heat pipe are respectively disposed through the two fin assemblies.

8. The heat dissipation device according to claim 6, wherein the thermally conductive component comprises a first contact part, a second contact part and a plurality of fin parts, the first contact part is configured to be in thermal contact with the heat source, the second contact part is disposed on the first contact part, the first pipe part of the at least one heat pipe is disposed between the first contact part and the second contact part, and the plurality of fin parts are disposed on the second contact part.

9. The heat dissipation device according to claim 6, wherein the engagement assembly comprises two first covers and two fasteners, the two first covers respectively press against the two fin assemblies, and the two fasteners are respectively disposed through the two first covers and the two fin assemblies and are configured to be fixed to the circuit board.

10. The heat dissipation device according to claim 6, wherein the engagement assembly comprises two fasteners, the first cover presses against the two fin assemblies, the two fasteners penetrate through the first cover and are respectively disposed through the two fin assemblies, and the two fasteners are configured to be fixed to the circuit board.

11. The heat dissipation device according to claim 5, wherein the heat dissipation device comprises a plurality of heat pipes.

12. The heat dissipation device according to claim 6, further comprising an airflow generator located between the two fin assemblies.

13. The heat dissipation device according to claim 12, further comprising at least one side cover disposed at the two fin assemblies so as to cover a side of the airflow generator.

14. The heat dissipation device according to claim 1, wherein an orthogonal projection of the at least one fin assembly on the circuit board at least partially overlaps an orthogonal projection of the thermally conductive component on the circuit board.

15. A heat dissipation device, configured to be in thermal contact with a heat source of a circuit board, the heat dissipation device comprising: a main body part, comprising a heat absorbing part and at least one heat dissipation part that are thermally coupled to each other, wherein a distance between the heat absorbing part and the circuit board is smaller than a distance between the at least one heat dissipation part and the circuit board; and an engagement assembly, comprising at least one first cover, a second cover and at least one fastener, wherein the at least one first cover presses against the at least one heat dissipation part, and the at least one fastener is disposed through the at least one first cover and the at least one heat dissipation part and is configured to be fixed to the circuit board; wherein the heat dissipation device further comprises a mount assembly configured to be disposed on the circuit board, the mount assembly has at least one screw hole, the at least one fastener is disposed through the at least one first cover, the at least one heat dissipation part and the second cover and is screwed into the at least one screw hole of the mount assembly so as to be fixed on the circuit board.

16. The heat dissipation device according to claim 15, wherein the second cover presses against a side of the thermally conductive component that is located away from the heat source, and the at least one fastener is disposed through the at least one first cover, the at least one heat dissipation part and the second cover.

17. The heat dissipation device according to claim 15, further comprising an elastic component, wherein the fastener comprises a head part and a body part that are connected to each other, the body part comprising a wider portion and a narrower portion that are connected to each other, the wider portion is located between and connected to the head part and the narrower portion, the wider portion is disposed through the first cover and the at least one heat dissipation part, the narrower portion is disposed through the second cover and screwed into the at least one screw hole of the mount assembly, two opposite ends of the elastic component respectively pressing against the a surface of the wider portion facing toward the circuit board and a surface of the second cover facing toward the wider portion.

18. The heat dissipation device according to claim 16, wherein the at least one fastener is configured to be fixed to the circuit board.

19. The heat dissipation device according to claim 16, further comprising at least one thermally conductive part thermally connected to the heat absorbing part and the at least one heat dissipation part.

20. The heat dissipation device according to claim 19, wherein the main body part comprises two heat dissipation parts, the heat absorbing part has a first pipe part and two second pipe parts, one of the two second pipe parts is connected to the other second pipe part via the first pipe part, the first pipe part is in thermal contact with the heat absorbing part, and two second pipe parts are respectively in thermal contact with the two heat dissipation parts.

21. The heat dissipation device according to claim 20, wherein the first pipe part of the at least one thermally conductive part is disposed through the heat absorbing part, and the two second pipe parts of the at least one thermally conductive part are respectively disposed through the two heat dissipation parts.

22. The heat dissipation device according to claim 20, wherein the heat absorbing part comprises a first contact part, a second contact part and a plurality of fin parts, the first contact part is configured to be in thermal contact with the heat source, the second contact part is disposed on the first contact part, the first pipe part of the at least one thermally conductive part is disposed between the first contact part and the second contact part, and the plurality of fin parts are disposed on the second contact part.

23. The heat dissipation device according to claim 20, wherein the engagement assembly comprises two first covers and two fasteners, the two first covers respectively press against the two heat dissipation parts, and the two fasteners are respectively disposed through the two first covers and the two heat dissipation parts and are configured to be fixed to the circuit board.

24. The heat dissipation device according to claim 20, wherein the engagement assembly comprises two fasteners, the first cover presses against the two heat dissipation parts, the two fasteners penetrate through the first cover and are respectively disposed through the two heat dissipation parts, and the two fasteners are configured to be fixed to the circuit board.

25. The heat dissipation device according to claim 19, wherein the heat dissipation device comprises a plurality of thermally conductive parts.

26. The heat dissipation device according to claim 20, further comprising an airflow generator located between the two heat dissipation parts.

27. The heat dissipation device according to claim 26, further comprising at least one side cover disposed at the two heat dissipation parts so as to cover a side of the airflow generator.

28. The heat dissipation device according to claim 15, wherein an orthogonal projection of the at least one heat dissipation part on the circuit board at least partially overlaps an orthogonal projection of the heat absorbing part on the circuit board.

29. A heat dissipation device, configured to be in thermal contact with a heat source of a circuit board, the heat dissipation device comprising:
 a main body part, comprising a thermally conductive component and at least one fin assembly, wherein the thermally conductive component is configured to be in thermal contact with the heat source, and the at least one fin assembly is thermally coupled to the thermally conductive component; and
 an engagement assembly, comprising at least one first cover and at least one fastener, wherein the at least one first cover presses against a side of the at least one fin assembly that is located away from the heat source;
 wherein the at least one fastener is inserted through the at least one first cover and all of a plurality of fins of the at least one fin assembly to the circuit board from a side of the first cover that is located away from the heat source.

30. A heat dissipation device, configured to be in thermal contact with a heat source of a circuit board, the heat dissipation device comprising:
 a main body part, comprising a heat absorbing part and at least one heat dissipation part that are thermally coupled to each other, wherein a distance between the heat absorbing part and the circuit board is smaller than a distance between the at least one heat dissipation part and the circuit board; and
 an engagement assembly, comprising at least one first cover and at least one fastener, wherein the at least one first cover presses against the at least one heat dissipation part;
 wherein the at least one fastener is inserted through the at least one first cover and all of a plurality of fins of the at least one heat dissipation part to the circuit board from a side of the first cover that is located away from the heat source.

* * * * *